(12) United States Patent
De Rege Thesauro et al.

(10) Patent No.: US 7,160,807 B2
(45) Date of Patent: Jan. 9, 2007

(54) CMP OF NOBLE METALS

(75) Inventors: Francesco De Rege Thesauro, Naperville, IL (US); Vlasta Brusic, Geneva, IL (US); Benjamin P. Bayer, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 122 days.

(21) Appl. No.: 10/610,407

(22) Filed: Jun. 30, 2003

(65) Prior Publication Data

US 2004/0266196 A1    Dec. 30, 2004

(51) Int. Cl.
*H01L 21/461* (2006.01)
*H01L 21/302* (2006.01)

(52) U.S. Cl. .................. 438/689; 438/690; 438/691; 438/692; 438/693

(58) Field of Classification Search ......... 438/690–693
See application file for complete search history.

(56) References Cited

U.S. PATENT DOCUMENTS

| 5,391,258 | A | 2/1995 | Brancaleoni et al. |
| 6,143,192 | A | 11/2000 | Westmoreland |
| 6,290,736 | B1 | 9/2001 | Evans |
| 6,332,831 | B1 | 12/2001 | Shemo et al. |
| 6,395,194 | B1 | 5/2002 | Russell et al. |
| 6,524,168 | B1 | 2/2003 | Luo et al. |
| 6,527,622 | B1 * | 3/2003 | Brusic et al. ............... 451/28 |
| 2002/0017063 | A1 | 2/2002 | Beitel et al. |
| 2002/0081853 | A1 | 6/2002 | Beitel et al. |
| 2003/0017419 | A1 | 1/2003 | Futase et al. |
| 2003/0119319 | A1 | 6/2003 | Nishant et al. |
| 2003/0194879 | A1 * | 10/2003 | Small et al. ............... 438/753 |

* cited by examiner

*Primary Examiner*—Duy-Vu N Deo
(74) *Attorney, Agent, or Firm*—Thomas Omholt; Francis Koszyk

(57) ABSTRACT

The invention provides a method of polishing a substrate comprising (i) contacting a substrate comprising a noble metal layer with a chemical-mechanical polishing system comprising (a) a polishing component, (b) an oxidizing agent, and (c) a liquid carrier, and (ii) abrading at least a portion of the noble metal layer to polish the substrate. The polishing component is selected from the group consisting of an abrasive, a polishing pad, or a combination thereof, and the oxidizing agent is selected from the group consisting of bromates, bromites, hypobromites, chlorates, chlorites, hypochlorites, perchlorates, iodates, hypoiodites, periodates, peroxyacetic acid, organo-halo-oxy compounds, salts thereof, and combinations thereof. The chemical-mechanical polishing system has a pH of about 9 or less, and the oxidizing agent does not produce a substantial amount of elemental halogen. The invention also provides a method of polishing a substrate comprising a noble metal layer and a second layer using the aforementioned polishing system that further comprises a stopping compound.

32 Claims, No Drawings

CMP OF NOBLE METALS

FIELD OF THE INVENTION

This invention pertains to a method of polishing a substrate comprising a noble metal.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad, U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in the chemical-mechanical polishing of semiconductor surfaces can result in poor surface quality. Because the performance of a semiconductor wafer is directly associated with the planarity of its surface, it is crucial to use a polishing composition and method that results in a high polishing efficiency, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Various metals and metal alloys have been used to form electrical connections between devices, including titanium, titanium nitride, aluminum-copper, aluminum-silicon, copper, tungsten, platinum, platinum-tungsten, platinum-tin, ruthenium, and combinations thereof Noble metals present a particular challenge in that they are mechanically hard and chemically resistant, making them difficult to remove efficiently through chemical-mechanical polishing.

The following patents disclose polishing compositions for noble metals. U.S. Pat. No. 5,691,219 discloses a semiconductor memory device comprising a noble metal conductive layer and a polishing composition comprising a halo-compound for polishing the noble metal. U.S. Pat. No. 6,274,063 discloses polishing compositions for nickel substrates comprising a chemical etchant (e.g., aluminum nitrate), abrasive particles, and an oxidizer. U.S. Pat. No. 6,290,736 discloses a chemically active polishing composition for noble metals comprising an abrasive and a halogen in basic aqueous solution. JP63096599 A2 discloses a method of dissolving metallic ruthenium. JP 11121411 A2 discloses a polishing composition for platinum group metals (e.g., Ru, Pt) comprising fine particles of an oxide of the platinum group metal. JP 1270512 A2 discloses a dissolving solution for noble metals comprising hydrogen peroxide, alkali cyanide, and phosphate ion and/or borate ion. WO 00/77107 A1 discloses a polishing composition for noble metals (e.g., Ru, Rh, Pd, Os, Ir, Pt) comprising an abrasive, a liquid carrier, an oxidizer, and a polishing additive that can include EDTA, nitrogen-containing macrocycles (e.g., tetraazacyclotetradecanes), crown ethers, halides, cyanides, citric acid, phosphines, and phosphonates. WO 01/44396 A1 discloses a polishing composition for noble metals comprising sulfur-containing compounds, abrasive particles, and water-soluble organic additives which purportedly improve the dispersion of the abrasive particles and enhance metal removal rates and selectivity.

A need remains, however, for polishing systems and polishing methods that will exhibit desirable planarization efficiency, uniformity, and removal rate during the polishing and planarization of substrates, while minimizing defectivity, such as surface imperfections and damage to underlying structures and topography during polishing and planarization. Improved polishing systems are particularly needed for the polishing of chemically stable and mechanically hard noble metal-containing substrates.

The present invention seeks to provide such a chemical-mechanical polishing system and method. These and other advantages of the invention will be apparent from the description of the invention provided herein.

BRIEF SUMMARY OF THE INVENTION

The invention provides a method of polishing a substrate comprising (i) contacting a substrate comprising a noble metal layer with a chemical-mechanical polishing system comprising (a) a polishing component, (b) an oxidizing agent, and (c) a liquid carrier, and (ii) abrading at least a portion of the noble metal layer to polish the substrate. The invention also provides a similar method of polishing a substrate comprising (i) contacting a substrate comprising a noble metal layer and a second layer with a chemical-mechanical polishing system comprising (a) a polishing component, (b) an oxidizing agent, (c) a liquid carrier, and (d) a stopping compound which suppresses the removal rate of the second layer, and (ii) abrading at least a portion of the noble metal layer to polish the substrate. The polishing component is selected from the group consisting of an abrasive, a polishing pad, or a combination thereof, and the oxidizing agent is selected from the group consisting of bromates, bromites, hypobromites, chlorates, chlorites, hypochlorites, perchlorates, iodates, hypoiodites, periodates, peroxyacetic acid, organo-halo-oxy compounds, salts thereof, and combinations thereof. The chemical-mechanical polishing system has a pH of about 9 or less, and the oxidizing agent does not produce a substantial amount of elemental halogen.

DETAILED DESCRIPTION OF THE INVENTION

The invention provides a method of polishing a substrate comprising (i) contacting a substrate comprising a noble metal layer with a chemical-mechanical polishing system comprising (a) a polishing component selected from the group consisting of an abrasive, a polishing pad, or a combination thereof, (b) an oxidizing agent selected from the group consisting of bromates, bromites, hypobromites, chlorates, chlorites, hypochlorites, perchlorates, iodates, hypoiodites, periodates, peroxyacetic acid, organo-halo-oxy compounds, salts thereof, and combinations thereof, and (c) a liquid carrier, wherein the chemical-mechanical polishing system has a pH of about 9 or less, and wherein the oxidizing agent does not produce a substantial amount of elemental halogen, and (ii) abrading at least a portion of the metal layer to polish the substrate.

As noted above, the polishing system comprises a polishing component selected from the group consisting of an abrasive, a polishing pad, or a combination thereof. The polishing system described herein desirably comprises an abrasive and a polishing pad. The abrasive can be in any suitable form (e.g., abrasive particles). The abrasive can be fixed on the polishing pad and/or can be in particulate form and suspended in the liquid carrier. The polishing pad can be any suitable polishing pad. The abrasive (when suspended in the liquid carrier) and the oxidizing agent, as well as any other components suspended in the liquid carrier, form the polishing composition of the chemical-mechanical polishing (e.g., CMP) system.

The abrasive can be any suitable abrasive. For example, the abrasive can be natural or synthetic, and can comprise certain hard polymers (e.g., polycarbonates), diamond (e.g., polycrystalline diamond), garnet, glass, carborundum, metal oxide, carbide, nitride, and the like. The abrasive desirably comprises a metal oxide. Suitable metal oxides include metal oxides selected from the group consisting of alumina, silica, ceria, zirconia, titania, germania, co-formed products thereof, and combinations thereof. Preferably, the metal oxide is selected from the group consisting of alumina, silica, ceria, and combinations thereof. More preferably, the metal oxide is alumina (e.g., α-alumina). The abrasive particles typically have an average particle size (e.g., average particle diameter) of about 20 nm to about 500 nm. Preferably, the abrasive particles have an average particle size of about 70 nm to about 300 nm (e.g., about 100 nm to about 200 nm).

When the abrasive is present in the polishing system and is suspended in the liquid carrier (i.e., when the abrasive is a component of the polishing composition), any suitable amount of abrasive can be present in the polishing composition. Typically about 0.1 wt. % or more (e.g., about 0.5 wt. % or more or about 1 wt. % or more) abrasive will be present in the polishing composition. The amount of abrasive in the polishing composition typically will not exceed about 30 wt. %, more typically will not exceed about 20 wt. % (e.g., will not exceed about 10 wt. %).

When the abrasive is suspended in the polishing composition, the polishing composition preferably is colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

A liquid carrier is used to facilitate the application of the abrasive (when present in the polishing composition), oxidizing agent, and any other additives to the surface of a suitable substrate to be polished or planarized. The liquid carrier can be any suitable liquid carrier. Typically, the liquid carrier is water, a mixture of water and a suitable water-miscible solvent, or an emulsion. Preferably, the liquid carrier comprises, consists essentially of, or consists of water, more preferably deionized water.

The oxidizing agent is selected from the group consisting of bromates, bromites, hypobromites, chlorates, chlorites, hypochlorites, perchlorates, iodates, hypoiodites, periodates, peroxyacetic acid, organo-halo-oxy compounds, salts thereof, and combinations thereof. As utilized herein, the term "organo-halo-oxy compound" is used to refer to oxidizing agents which contain at least one organic functional group, at least one halogen atom, and at least one oxygen atom. The organic functional group(s), halogen atom(s), and oxygen atom(s) of the organo-halo-oxy compound can be arranged in any suitable manner, but will conform to one of three general formulas: $R_a-X-O_b$, $R_a-O_b-X$, or $O_b-R_a-X$, wherein R represents an organic functional group, X represents a halogen atom, and a and b are integers greater than or equal to one. Suitable organo-halo-oxy compounds include, but are not limited to, N-chlorosuccinimide, N-bromosuccinimide, N-bromoacetamide, N-bromobenzophenoneimine, iodine triacetate, iodine tris(trifluoroacetate), iodobenzene diacetate, pentrafluoroiodobenzene bis(trifluoroacetate), iodosobenzene, iodoxybenzene, iodoxybenzoic acid (e.g., m-iodoxybenzoic acid), salts thereof, and combinations thereof. Preferably, the oxidizing agent is selected from the group consisting of bromates, iodates, chlorates, perchlorates, and periodates. More preferably, the oxidizing agent is a bromate, iodate, or periodate. The oxidizing agent also does not produce a substantial amount of elemental halogen in the chemical-mechanical polishing system. As utilized herein, an oxidizing agent does not produce a substantial amount of elemental halogen if the molar concentration of elemental halogen at equilibrium is about 10 percent or less (e.g., about 5 percent or less, or about 3 percent or less, or about 2 percent or less, or about 1 percent or less) of the initial molar concentration of the oxidizing agent.

The chemical-mechanical polishing system can comprise any suitable amount of the oxidizing agent. Typically, the chemical-mechanical polishing system comprises about 0.1 wt. % or more (e.g., about 0.2 wt. % or more, about 0.5 wt. % or more, or about 1 wt. % or more) oxidizing agent, based on the weight of the liquid carrier and any components dissolved or suspended therein. The chemical-mechanical polishing system typically comprises about 15 wt. % or less (e.g., about 12 wt. % or less, about 10 wt. % or less, about 8 wt. % or less, or about 5 wt. % or less) oxidizing agent, based on the weight of the liquid carrier and any components dissolved or dispersed therein.

The metal layer of the substrate can comprise any suitable noble metal. Suitable noble metals include, but are not limited to, platinum, iridium, rhenium, ruthenium, rhodium, palladium, silver, osmium, gold, nitrides thereof, oxides thereof, and alloys thereof. Suitable alloys include, but are not limited to, "cermet" materials such as ruthenium-stabilized zirconia and ruthenium yttrium-stabilized zirconia (YSZ, $(ZrO_2)_{1-x}(SC_2O_3)_x$) Preferably, the metal layer comprises ruthenium or iridium.

The chemical-mechanical polishing system has a pH of about 9 or less. Preferably, the chemical-mechanical polishing system has a pH of about 7 or less (e.g., about 6 or less, about 5 or less, or about 4 or less). Typically, the chemical-mechanical polishing system has a pH of about 1 or more (e.g., about 2 or more).

The pH of the chemical-mechanical polishing system can be achieved and/or maintained by any suitable means. More specifically, the polishing composition can further comprise a pH adjustor, a pH buffering agent, or a combination thereof The pH adjustor can be any suitable pH-adjusting compound. For example, the pH adjustor can be potassium hydroxide, sodium hydroxide, ammonium hydroxide, or a combination thereof. The pH buffering agent can be any suitable buffering agent, for example, phosphates, acetates, borates, ammonium salts, and the like. The chemical-mechanical polishing system can comprise any suitable amount of a pH adjustor and/or a pH buffering agent, provided such amount is sufficient to achieve and/or maintain the pH of the polishing system within the ranges set forth herein.

The chemical-mechanical polishing system optionally further comprises a chelating or complexing agent. The complexing agent is any suitable chemical additive that enhances the removal rate of the substrate layer being removed. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). Preferably, the complexing agent is a carboxylate salt, more preferably an oxalate salt. The choice of chelating or complexing agent will depend on the type of substrate layer being removed.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof, phthalates include phthalic acid, as well as mono-salts (e.g., potassium hydrogen phthalate) and di-salts thereof perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The chemical-mechanical polishing system optionally further comprises a corrosion inhibitor (i.e., a film-forming agent). The corrosion inhibitor can be any suitable corrosion inhibitor. Typically, the corrosion inhibitor is an organic compound containing a heteroatom-containing functional group. For example, the film-forming agent is a heterocyclic organic compound with at least one 5- or 6-member heterocyclic ring as the active functional group, wherein the heterocyclic ring contains at least one nitrogen atom, for example, an azole compound. Preferably, the film-forming agent is a triazole, more preferably, 1,2,4-triazole, 1,2,3-triazole, or benzotriazole. The amount of corrosion inhibitor used in the polishing system typically is about 0.0001 wt. % to about 3 wt. % (preferably about 0.001 wt. % to about 2 wt. %) based on the weight of the liquid carrier and any components dissolved or suspended therein.

The chemical-mechanical polishing system optionally further comprises a surfactant. Suitable surfactants can include, for example, cationic surfactants, anionic surfactants, nonionic surfactants, amphoteric surfactants, mixtures thereof, and the like. Preferably, the polishing system comprises a nonionic surfactant. One example of a suitable nonionic surfactant is an ethylenediamine polyoxyethylene surfactant. The amount of surfactant typically is about 0.0001 wt. % to about 1 wt. % (preferably about 0.001 wt. % to about 0.1 wt. %, or about 0.005 wt. % to about 0.05 wt. %) based on the weight of the liquid carrier and any components dissolved or suspended therein.

The chemical-mechanical polishing system optionally further comprises an antifoaming agent. The anti-foaming agent can be any suitable anti-foaming agent. Suitable antifoaming agents include, but are not limited to, silicon-based and acetylenic diol-based antifoaming agents. The amount of anti-foaming agent present in the polishing composition typically is about 40 ppm to about 140 ppm.

The chemical-mechanical polishing system optionally further comprises a biocide. The biocide can be any suitable biocide, for example an isothiazolinone biocide. The amount of biocide used in the polishing composition typically is about 1 to about 50 ppm, preferably about 10 to about 20 ppm.

The invention also provides a method of polishing a substrate comprising a noble metal layer and a second layer. The second layer is different than the noble metal layer. In particular, the method comprises (i) contacting a substrate comprising a noble metal layer and a second layer with a chemical-mechanical polishing system comprising (a) a polishing component selected from the group consisting of an abrasive, a polishing pad, or a combination thereof, (b) an oxidizing agent selected from the group consisting of bromates, bromites, hypobromites, chlorates, chlorites, hypochlorites, perchlorates, iodates, hypoiodites, periodates, peroxyacetic acid, organo-halo-oxy compounds, salts thereof, and combinations thereof, (c) a stopping compound which suppresses the removal rate of the second layer, and (d) a liquid carrier, wherein the chemical-mechanical polishing system has a pH of about 9 or less, and wherein the oxidizing agent does not produce a substantial amount of elemental halogen, and (ii) abrading at least a portion of the noble metal layer to polish the substrate. The aspects of the method and components of the polishing system are as otherwise described herein except for the use of the stopping compound to suppress the removal rate of the second layer that exists on the substrate.

The stopping compound can be any suitable compound which suppresses the removal rate of the second layer. Suitable stopping compounds include, but are not limited to, cationically charged nitrogen containing compounds selected from the group consisting of amines, imines, amides, imides, polymers thereof, and mixtures thereof. The term "cationically charged" as used herein means that a portion (e.g., about 5% or more, about 10% or more, about 15% or more, or about 20% or more) of the stopping compound in the liquid portion of the system is in cationic form at the operating pH of the polishing system of the invention. Preferably, the stopping compound has a pKa value that is 1 or more units greater than the operating pH of the liquid portion of the system. Preferred stopping compounds include polyetheramine, polyethylenimine, $N_4$-amino(N,N'-bis-[3-aminopropyl]ethylenediamine), 4,7, 10-trioxatridecane-1,13-diamine, 3,3-dimethyl-4,4-diaminodicyclohexylmethane, 2-phenylethylamine, N,N-dimethyldipropylenetriamine, 3-[2-methoxyethoxy]propylamine, dimethylaminopropylanine, 1,4-bis(3-aminopropyl)piperazine, and mixtures thereof. In addition, preferred stopping compounds include isophoronediamine, hexamethylenediamine, cyclohexyl-1,3-propanediamine, thiomicamine, (aminopropyl)-1,3-propanediamine, tetraethylenepentamine, tetramethylbutanediamine, propylamine, diaminopropanol, aninobutanol, (2-aminoethoxy)ethanol, and mixtures thereof.

Stopping compounds suitable for use in the invention also include polymers. Suitable polymers include, but are not limited to, amine-containing polymers. Suitable amine-containing polymers preferably have 5 or more sequential atoms separating the nitrogen atoms of the amino functional groups. For example, the amine-containing polymer can have about 7 or more (e.g., about 10 or more) sequential atoms separating the nitrogen atoms of the amino functional groups. Thus, amine-containing polymers like polyvinylamine and polyethylenimine (each having 3 sequential atoms separating the nitrogen atoms of the amino functional groups) do not qualify as such an amine-containing polymer. The amine-containing polymer can be a condensation polymer comprising repeating units that contain an amino functional group (e.g., a polyaminoamide). Such condensation polymers can be prepared by reaction of a polyamine monomer with a diacid monomer. Preferably, the condensation copolymer is a diethylenetriamine/adipic acid condensation copolymer. The amine-containing polymer also can be polydiallyldimethylammonium chloride or a copolymer comprising repeating units containing one or more amine functional groups and repeating units selected from the group consisting of amides, vinyl acetate, vinyl alcohol, ethylene oxide, and propylene oxide. For example, the amine-containing polymer can be a copolymer of vinylamine and vinyl alcohol.

Suitable amine-containing polymers also include block copolymers with at least one polymer block comprising one or more amine functional groups and at least one polymer block not comprising any amine functional groups. The amine-containing block copolymer can be an AB diblock, ABA triblock, or ABC triblock copolymer. The amine-containing block copolymer can also be a graft copolymer. Typically, the polymer blocks comprising one or more amine functional groups are about 10 wt. % or more of the amine-containing block copolymer. Preferably, the polymer blocks comprising one or more amine functional groups are about 20 wt. % or more (e.g., about 40% or more) of the amine-containing block copolymer. The amine-containing bJock can be any amine-containing polymer block and can have about 3 or more (e.g., about 5 or more) sequential atoms separating the nitrogen atoms of the amino functional groups.

Suitable stopping compounds further include compounds containing at least two acid groups where the pKa of the first dissociable acid is not substantially larger than the pH of the chemical-mechanical polishing system. As utilized herein, the pKa of the first dissociable acid is not substantially larger than the pH of the chemical-mechanical polishing system if the pKa is no more than 0.5 units greater than the pH of the polishing system. Preferred stopping compounds include compounds having two or more carboxylate groups with hydoxyl groups in an alpha position, such as straight chain mono- and di-carboxylic acids and salts thereof (e.g., malic acid, malates, tartaric acid, tartrates, gluconic acid, and gluconates), tri- and polycarboxylic acids and salts with secondary or tertiary hydroxyl groups in an alpha position relative to a carboxylic group (e.g., citric acid and citrates), and compounds containing a benzene ring (e.g., ortho di- and polyhydroxybenzoic acids and acid salts, phthalic acid and acid salts, pyrocatecol, pyrogallol, gallic acid, gallates, tannic acid, and tannates).

The following examples further illustrate the invention but, of course, should not be construed as in any way limiting its scope.

EXAMPLE 1

This example demonstrates the effect of oxidizing agents on the polishing of ruthenium in the context of a polishing system.

The dissolution and corrosion rates of ruthenium were evaluated electrochemically using a ruthenium rotating disk electrode (RDE) in the presence of different polishing compositions (Polishing Compositions 1A–1D). The ruthenium electrode was rotating at 500 rpm and held in contact with an abrasive pad with a down force of about 90 kPa (13 psi). The metal dissolution rate was evaluated as the surface of the electrode was abraded (dissolution rate) and after abrasion (corrosion rate). The ruthenium activity was measured as a current density and then recalculated into a dissolution rate or corrosion rate.(in Å/min) using Faraday's law.

Each of the polishing compositions (except Polishing Composition 1A) contained an oxidizing agent at a concentration of approximately 1 N and had a pH of approximately 1. The dissolution and corrosion rates for ruthenium were measured for each of the chemical-mechanical polishing systems. The results are summarized in Table 1.

TABLE 1

Ruthenium Dissolution and Corrosion Rates

| Polishing Composition | Oxidizing Agent | Ru Dissolution Rate (Å/min) | Ru Corrosion Rate (Å/min) |
|---|---|---|---|
| 1A (comparative) | None | 12.9 | 0.1 |
| 1B (invention) | $HIO_4$ | 64 | 63 |
| 1C (invention) | $KClO_3$ | 16.7 | 0.5 |
| 1D (invention) | $KBrO_3$ | 155 | 51.6 |

These results demonstrate that relatively high noble metal dissolution rates can be achieved using the method of the invention.

EXAMPLE 2

This example demonstrates the effect of oxidizing agents on the polishing of iridium in the context of a polishing system.

The dissolution and corrosion rates of iridium were evaluated electrochemically using a iridium rotating disk electrode (RDE) in the presence of different polishing compositions (Polishing Compositions 2A–2E). The iridium electrode was rotating at 500 rpm and held in contact with an abrasive pad with a down force of about 90 kPa (13 psi). The metal dissolution rate was evaluated as the surface of the electrode was abraded (dissolution rate) and after abrasion (corrosion rate). The iridium activity was measured as a current density and then recalculated into a dissolution rate or corrosion rate (in Å/min) using Faraday's law.

Each of the polishing compositions (except Polishing Composition 2A) contained an oxidizing agent at a concentration of approximately 1 N and had a pH of approximately 1. The dissolution and corrosion rates for iridium were measured for each of the chemical-mechanical polishing systems. The results are summarized in Table 2.

TABLE 2

Iridium Dissolution and Corrosion Rates

| Polishing Composition | Oxidizing Agent | Ir Dissolution Rate (Å/min) | Ir Corrosion Rate (Å/min) |
|---|---|---|---|
| 2A (comparative) | None | 3.2 | 1.1 |
| 2B (invention) | $HIO_4$ | 364 | 260 |
| 2C (invention) | $KClO_3$ | 15.6 | 2.1 |
| 2D (invention) | $KIO_3$ | 15.6 | 3.9 |
| 2E (invention) | $KBrO_3$ | 39 | 2.1 |

These results demonstrate that relatively high noble metal dissolution rates can be achieved using the method of the invention.

EXAMPLE 3

This example compares the effect of oxidizing agents in a polishing system on the polishing of an iridium-containing substrate.

Similar substrates comprising iridium, silicon oxide, and silicon nitride were polished with different polishing compositions (Polishing Compositions 3A–3F). Each polishing composition contained 4 wt. % silica and had a pH of approximately 4. In addition, each of the polishing compositions (except Polishing Composition 3A) contained an oxidizing agent. The identity and concentration of the oxidizing agent in each of Polishing Compositions 3B–3F are set forth in Table 3.

The iridium removal rates (RR) and within-wafer-non-uniformity (WIWNU) were determined for each of the chemical-mechanical polishing systems, and the results are summarized in Table 3.

TABLE 3

Iridium Removal Rates and WIWNU Measurements

| Polishing Composition | Oxidizing Agent | Amount of Oxidizer (wt. %) | Ir RR (Å/min) | WIWNU (%) |
|---|---|---|---|---|
| 3A (comparative) | None | — | 5 | 38 |
| 3B (comparative) | $H_2O_2$ | 0.6 | 4 | 20 |
| 3C (invention) | $NaClO_4$ | 2.2 | 112 | 11 |
| 3D (invention) | $KIO_4$ | 0.04 | 148 | 11.1 |
| 3E (invention) | $KBrO_3$ | 3 | 316 | 8.5 |
| 3F (invention) | $KIO_3$ | 3.8 | 510 | 24 |

These results demonstrate that the method of the invention can be used to polish a noble-metal containing substrate at a relatively high rate. In particular, when the substrate is polished according to the method of the invention, the removal rate of the noble metal is approximately 20 to 100 times greater than the removal rate when no oxidizing agent is used. The method of the invention shows a similar increase over a polishing method using hydrogen peroxide as the oxidizing agent. The method of the invention results in a substantial decrease in within-wafer-non-uniformity as compared to a similar method using no oxidizing agent. Furthermore, the method of the invention using Polishing Compositions 3D and 3E showed a marked decrease in within-wafer-non-uniformity over a polishing method using hydrogen peroxide as the oxidizing agent.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any nonclaimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate comprising a noble metal layer and a second layer with a chemical-mechanical polishing system comprising:
      (a) a polishing component selected from the group consisting of an abrasive, a polishing pad, or a combination thereof,
      (b) an oxidizing agent selected from the group consisting of bromates, bromites, hypobromites, chlorates, chlorites, hypochlorites, iodates, hypoiodites, organo-halo-oxy compounds, salts thereof, and combinations thereof, (c) a stopping compound which suppresses the removal rate of the second layer, wherein the stopping compound is a cationically charged nitrogen-containing compound selected from the group consisting of amines, imines, amides, imides, polymers thereof, and mixtures thereof, and (d) a liquid carrier, wherein the chemical-mechanical polishing system has a pH of about 9 or less, and wherein the oxidizing agent does not produce a substantial amount of elemental halogen, and (ii) abrading at least a portion of the noble metal layer to polish the substrate.

2. The method of claim 1, wherein the organo-halo-oxy compound is selected from the group consisting of N-chlorosuccinimide, N-bromosuccinimide, N-bromoacetamide, N-bromobenzophenoneimine, iodine triacetate, iodine tris (trifluoroacetate), iodobenzene diacetate, pentrafluoroiodobenzene bis(trifluoroacetate), iodosobenzene, iodoxybenzene, iodoxybenzoic acid, salts thereof, and combinations thereof.

3. The method of claim 1, wherein the chemical-mechanical polishing system has a pH of about 7 or less.

4. The method of claim 3, wherein the chemical-mechanical polishing system has a pH of about 4 or less.

5. The method of claim 4, wherein the chemical-mechanical polishing system has a pH of about 1 to about 4.

6. The method of claim 1, wherein the metal layer comprises a noble metal selected from the group consisting of platinum, iridium, rhenium, ruthenium, rhodium, palladium, silver, osmium, gold, nitrides thereof, oxides thereof, and alloys thereof.

7. The method of claim 6, wherein the metal layer comprises ruthenium.

8. The method of claim 7, wherein the chemical-mechanical polishing system comprises about 0.1 wt. % to about 5 wt. % oxidizing agent based on the weight of the liquid carrier and any components dissolved or suspended therein.

9. The method of claim 8, wherein the oxidizing agent is a bromate or an iodate.

10. The method of claim 9, wherein the chemical-mechanical polishing system comprises an abrasive suspended in the liquid carrier and the abrasive is a metal oxide abrasive selected from the group consisting of alumina, silica, ceria, zirconia, titania, germania, and combinations thereof.

11. The method of claim 10, wherein the metal oxide abrasive is silica.

12. The method of claim 9, wherein the chemical-mechanical polishing system comprises an abrasive, and the abrasive is fixed to a polishing pad.

13. The method of claim 6, wherein the metal layer comprises iridium.

14. The method of claim 13, wherein the chemical-mechanical polishing system comprises about 0.1 wt. % to about 5 wt. % oxidizing agent based on the weight of the liquid carrier and any components dissolved or suspended therein.

15. The method of claim 1, wherein the chemical-mechanical polishing system comprises about 0.1 wt. % to about 5 wt. % oxidizing agent based on the weight of the liquid carrier and any components dissolved or suspended therein.

16. The method of claim 1, wherein the oxidizing agent is a bromate.

17. The method of claim 1, wherein the oxidizing agent is an iodate.

18. The method of claim 1, wherein the chemical-mechanical polishing system comprises an abrasive, and the abrasive is suspended in the liquid carrier.

19. The method of claim 18, wherein the liquid carrier comprises water.

20. The method of claim 18, wherein the abrasive is a metal oxide abrasive selected from the group consisting of alumina, silica, ceria, zirconia, titania, germania, and combinations thereof.

21. The method of claim 20, wherein the metal oxide abrasive is silica.

22. The method of claim 1, wherein the liquid carrier comprises water.

23. The method of claim 1, wherein the chemical-mechanical polishing system comprises an abrasive, and the abrasive is fixed to a polishing pad.

24. The method of claim 1, wherein the chemical-mechanical polishing system further comprises a component selected from the group consisting of a complexing agent, a pH buffering agent, a surfactant, and combinations thereof.

25. The method of claim 1, wherein the stopping compound is selected from the group consisting of a polyetheramine, N-4-amino(N,N'-bis-[3-aminopropyl]ethylenediamine), 4,7,10-trioxatridecane-1,13-diamine, 3,3-dimethyl-4,4-diaminodicyclohexylmethane, 2-phenylethylamine, N,N-dimethyldipropylenetriamine, 3-(2-methoxyethoxy)propylamine, isophoronediamine, hexamethylenediamine, cyclohexyl-1,3-propanediamine, thiomicamine, (aminopropyl)-1,3-propanediamine, tetraethylenepentamine, tetramethylbutanediamine, propylamine, diaminopropanol, aminobutanol, (2-aminoethoxy)ethanol, and mixtures thereof.

26. The method of claim 1, wherein the stopping compound is an amine-containing polymer.

27. The method of claim 26, wherein the amine-containing polymer has 5 or more sequential atoms separating the nitrogen atoms of the amino functional groups.

28. The method of claim 26, wherein the stopping compound is an amine-containing polymer selected from the group consisting of condensation polymers comprising repeating units tat contain an amino functional group, polydiallyldimethylammonium chloride, and a copolymer comprising repeating units containing one or more amine functional groups and repeating units selected from the group consisting of amides, vinyl acetate, vinyl alcohol, ethylene oxide, and propylene oxide.

29. The method of claim 26, wherein the amine-containing polymer is an amine-containing block copolymer with at least one polymer block comprising one or more amine functional groups and at least one polymer block not comprising any amine functional groups.

30. A method of polishing a substrate comprising:
(i) contacting a substrate comprising a noble metal layer and a second layer with a chemical-mechanical polishing system comprising:
  (a) a polishing component selected from the group consisting of an abrasive, a polishing pad, or a combination thereof,
  (b) an oxidizing agent selected from the group consisting of perchlorates, periodates, peroxyacetic acid, salts thereof, and combinations thereof,
  (c) an amine-containing polymer having 5 or more sequential atoms separating the nitrogen atoms of the amino functional groups, and
  (d) a liquid carrier, wherein the chemical-mechanical polishing system has a pH of about 9 or less, and wherein the oxidizing agent does not produce a substantial amount of elemental halogen, and (ii) abrading at least a portion of the noble metal layer to polish the substrate.

31. The method of claim 30, wherein the amine-containing polymer is selected from the group consisting of condensation polymers comprising repeating units that contain an amino functional group, polydiallyldimethylammonium chloride, and a copolymer comprising repeating units containing one or more amine functional groups and repeating units selected from the group consisting of amides, vinyl acetate, vinyl alcohol, ethylene oxide, and propylene oxide.

32. The method of claim 30, wherein the amine-containing polymer is a block copolymer with at least one polymer block comprising one or more amine functional groups and at least one polymer block not comprising any amine functional groups.

* * * * *